United States Patent [19]
Horikoshi

[11] Patent Number: 6,154,329
[45] Date of Patent: Nov. 28, 2000

[54] RECORDING APPARATUS AND METHOD FEATURING EFFICIENT HANDLING OF DATA EXTENSION

[75] Inventor: Takayuki Horikoshi, Kanagawa, Japan

[73] Assignee: Sony Corporation, Tokyo, Japan

[21] Appl. No.: 09/044,462

[22] Filed: Mar. 19, 1998

[30] Foreign Application Priority Data

Mar. 24, 1997 [JP] Japan ..................................... 9-088855

[51] Int. Cl.[7] ................................ G11B 5/00; G11B 5/09
[52] U.S. Cl. .................................................. 360/8; 360/48
[58] Field of Search .................... 360/8, 48; 369/124.06, 369/59

[56] References Cited

U.S. PATENT DOCUMENTS 5,237,460   8/1993   Miller et al. ................................ 360/8

*Primary Examiner*—W. Chris Kim
*Attorney, Agent, or Firm*—Frommer Lawrence & Haug, LLP; William S. Frommer; Bruno Polito

[57] ABSTRACT

In a data recording apparatus and its method, data is compressed in units of a stated data block, it is detected in units of the data block whether or not data extension has occurred in consequence of the compression processing. Then, the compressed data is recorded on a recording medium in the case where the data extension has not detected, and on the other hand, in the case where the data extension has detected, the original data is recorded on a recording medium with respect to a stated number of data blocks subsequent to the data block in which the data extension has occurred. Thereby, a data recording apparatus and its method can be realized with a simple construction, which can record non-compressed original data on the recording medium with respect to a string of data in which the data extension is apt to occur, and thus can alleviate bad influence of data extension which occur in consequence of the compression processing.

4 Claims, 5 Drawing Sheets

RECORDING APPARATUS AND METHOD FEATURING EFFICIENT HANDLING OF DATA EXTENSION

BACKGROUND OF THE INVENTION

1. Field of the Invention

This invention relates a data recording apparatus and its method, and more particularly, is suitably applied to a data recording apparatus (tape streamer) which records back-up data of a computer on a magnetic tape.

2. Description of the Related Art

In recent years, data compression technology has been progressed, and so a data recording apparatus, including a tape streamer, has appeared which can record data exceeding the physical storage capacity on a recording medium by performing data compression processing without decreasing of quantity of information in real time.

FIG. 1 shows a constitution of a tape streamer out of such data recording apparatuses.

In this case, a host computer 1 usually divides one file of data D1 into plural data blocks, and then transfers it to a tape streamer 2 in units of a data blocks. Besides, the host computer 1 transfers a record command of a tape mark indicating the end of the file, at the last of each file.

Then, the tape streamer 2 sequentially takes in the data D1 supplied from the host computer 1 via an interface bus, through an interface controller 3, and then delivers this to a data compressor 5 and a first switching terminal 6A of a switch circuit 6 in units of a data block under the control of a CPU 4.

The data compressor 5 performs compression coding on the supplied data D1 with a stated format in units of a data block, and then delivers the resulted one data block of compressed data D2 to a second switching terminal 6B of the switch circuit 6, under the control of the CPU 4.

At this time, the CPU 4 has already selected either of a non-compression mode or a compression mode on the basis of a command given from the host computer 2; at the time of the non-compression mode, it causes the switch circuit 6 to select the first switching terminal 6A in order to transfer the non-compressed original data D1 to a buffer memory 7; on the other hand, at the time of the compression mode, it causes the switch circuit 6 to select the second switching terminal 6B in order to transfer the compressed data D2 to, the buffer memory 7.

Under the control of the CPU 4, the buffer memory 7 sequentially stores the supplied data D1 or compressed data D2, and delivers the stored data D1 or compressed data D2 to a data processing section 8 after adding the identifying information of the non-compressed data or compressed data to it.

Then, the data processing section 8 performs stated data processing such as addition of error correcting code on the data D1 or the compressed data D2 which is supplied from the buffer memory 7, and then records this on a magnetic tape 10 via a recording head 9, under the control of the CPU 4.

In addition, when a record command of a tape mark has been given from the CPU 4, the data processing section 8 records the tape mark on the magnetic tape 10 via the recording head 9.

In this way, in the tape streamer 2, the data D1 which is supplied from the host computer 1 can be recorded on the magnetic tape 10 in units of a data block with adding a tape mark TM to the last of each file, as shown in FIG. 2.

By the way, in the tape streamer 2, the compression rate of the data D1 greatly varies because of depending on the property of a string of data which is inputted to the data compressor 5.

In fact, in the case where a string of data which has been highly randomized is inputted as the data D1, data extension may occur on the contrary by passing it through the data compressor 5, and the data length of the compressed data D2 may become longer than the data length of the original data D1.

And, such a case has a problem in that the substantial quantity of data which is recorded on the magnetic tape 10 by the tape streamer 2 becomes smaller than the physical storage capacity of the magnetic tape 10.

As one method to solve such a problem, it has been proposed that a tape streamer 11 is composed as shown in FIG. 3 in which the same reference numerals are applied to parts corresponding to FIG. 1.

In fact, the tape streamer 11 is provided with a buffer memory (hereinafter, this is referred to as an original-data holding buffer-memory) 13 in parallel to a data compressor 12, in which the data D1 to be transferred to the data compressor 12 is stored in the original-data holding buffer-memory 13.

Then, the data compressor 12 sequentially compresses the supplied data D1 in units of a data block, and then sequentially delivers the obtained compressed data D2 to a second switching terminal 14B of a switch circuit 14, and also delivers information indicating whether or not data extension has occurred in consequence of the compression processing, to a CPU 15 as a data-extension information signal S1 for each data block.

At the time of the compression mode, the CPU 15 controls and causes the switch circuit 6 to select the second switching terminal 6B, and in addition, judges based on the data-extension information signal S1 whether or not the data extension has occurred. In the case where it has determined that the data extension has not occurred, the CPU 15 controls and causes the switch circuit 14 to select the second switching terminal 14B, thereby the very data block of the compressed data D2 is given to the data processing section 8, via the switch circuit 14, the switch circuit 6, and the buffer memory 7 sequentially, in order to record this on the magnetic tape 10 via the recording head 9.

In contrast with this, when the CPU 15 has determined based on the data-extension information signal S1 at the time of the compression mode that the data extension has occurred, it causes the switch circuit 14 to select the first switching terminal 14A, thereby with respect to the very data block, the original data D1 stored in the original-data holding buffer-memory 13 is given to the data processing section 8, via the switch circuit 14, the switch circuit 6, and the buffer memory 7 sequentially, in order to record this on the magnetic tape 10 via the recording head 9.

In this way, for each data block, the tape streamer 11 selects either one which has less data-quantity, out of the original data D1 and the compressed data D2 so as to record it on the magnetic tape 10, and thus can prevent suffering bad influence from the data extension which occurs in consequence of the compression processing (that is, the substantial record quantity of data becomes smaller than the physical storage capacity of the magnetic tape 10).

However, the case where a tape streamer is composed in this way has such problems in that it is needed to add the original-data holding buffer-memory 13 and the switch circuit 14 to the tape streamer 2 of FIG. 1 as described above, and so the constitution is complicated and enlarged as a whole.

Besides, the case where a tape streamer is composed in this way has such problems in that a buffer memory having large storage capacity is needed as the original-data holding buffer-memory 13 and so the manufacturing cost of the tape streamer 11 is raised correspondingly, when the data quantity of each data block becomes large as the case where the data D1 to be supplied from the host computer 1 is, for instance, image data.

SUMMARY OF THE INVENTION

In view of the foregoing, an object of this invention is to provide a data recording apparatus and its method with a simple constitution, which can alleviate bad influence of data extension which occurs in consequence of compression processing.

The foregoing object and other object of the invention have been achieved by the provision of a data recording apparatus and its method, in which compressing means for compressing data in stated units of a data block, detecting means for detecting in units of a data block whether or not data extension has occurred in consequence of compression processing of the compressing means, and recording means, at the time of a compression mode, for recording the data compressed by the compressing means on a recording medium in the case where it is determined based on the detection result of the detecting means that the data extension has not occurred in consequence of the compression processing, and on the other hand, in the case where the data extension has occurred in consequence of the compression processing, for recording the original data on the recording medium with respect to a stated number of the data blocks subsequent to the data block in which the data extension has occurred are provided.

As a result, with respect to a string of data in which the data extension is apt to occur in consequence of the compression processing, the original data which has been not compressed can be recorded on the recording medium.

Further, the present invention provides a first step of compressing data in stated units of a data block and detecting in units of a data block whether or not the data extension has occurred in consequence of the compression processing, and a second step of recording the compressed data on a recording medium in the case where the data extension has not occurred in consequence of the compression processing, and on the other hand, in the case where the data extension has occurred in consequence of the compression processing, for recording the original data on the recording medium with respect to a stated number of the data blocks subsequent to the data block in which the data extension has occurred.

As a result, with respect to a string of data in which the data extension is apt to occur due the compression processing, the original data which has been not compressed can be recorded on the recording medium.

The nature, principle and utility of the invention will become more apparent from the following detailed description when read in conjunction with the accompanying drawings in which like parts are designated by like reference numerals or characters.

DETAILED DESCRIPTION OF THE EMBODIMENT

Figure 4:
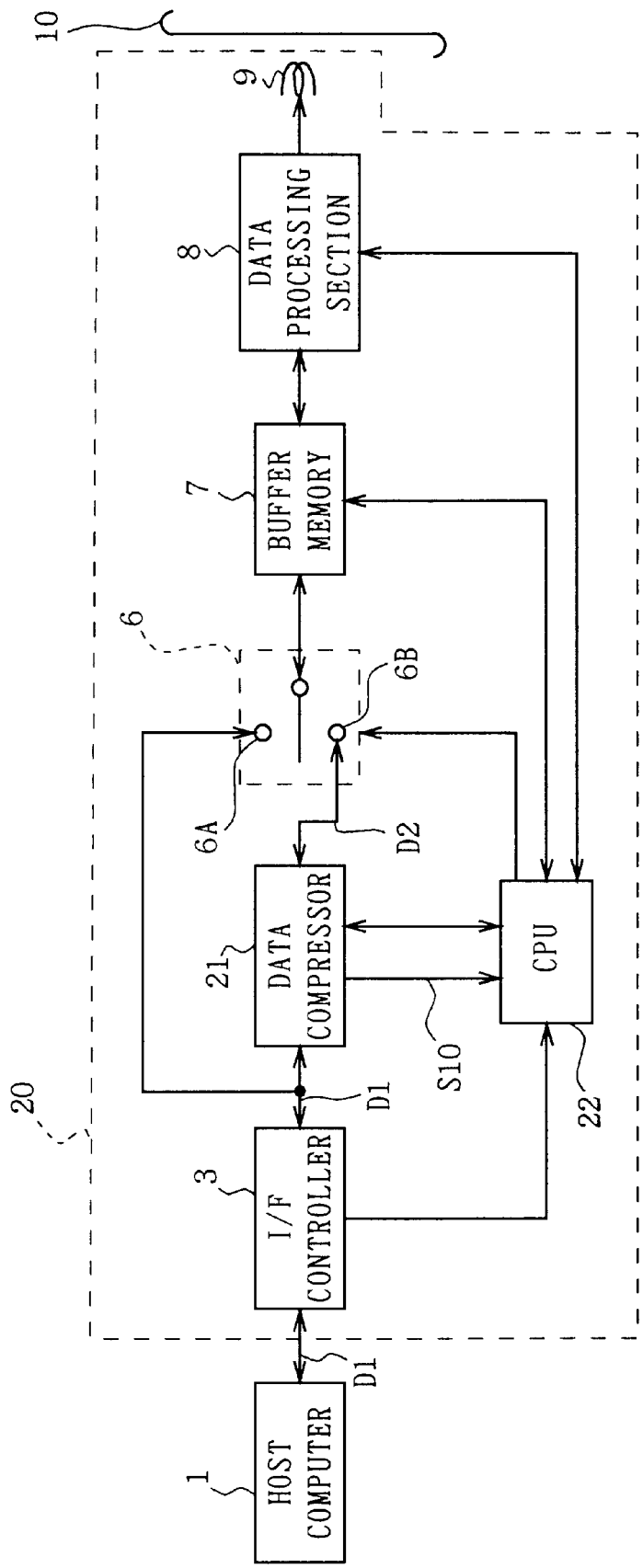
FIG. 4 is a block diagram showing a constitution of a tape streamer according to an embodiment of the present invention.

Preferred embodiments of this invention will be described with reference to the accompanying drawings:

(1) Constitution of a Tape Streamer According to an Embodiment (FIG. 4)

Figure 1:
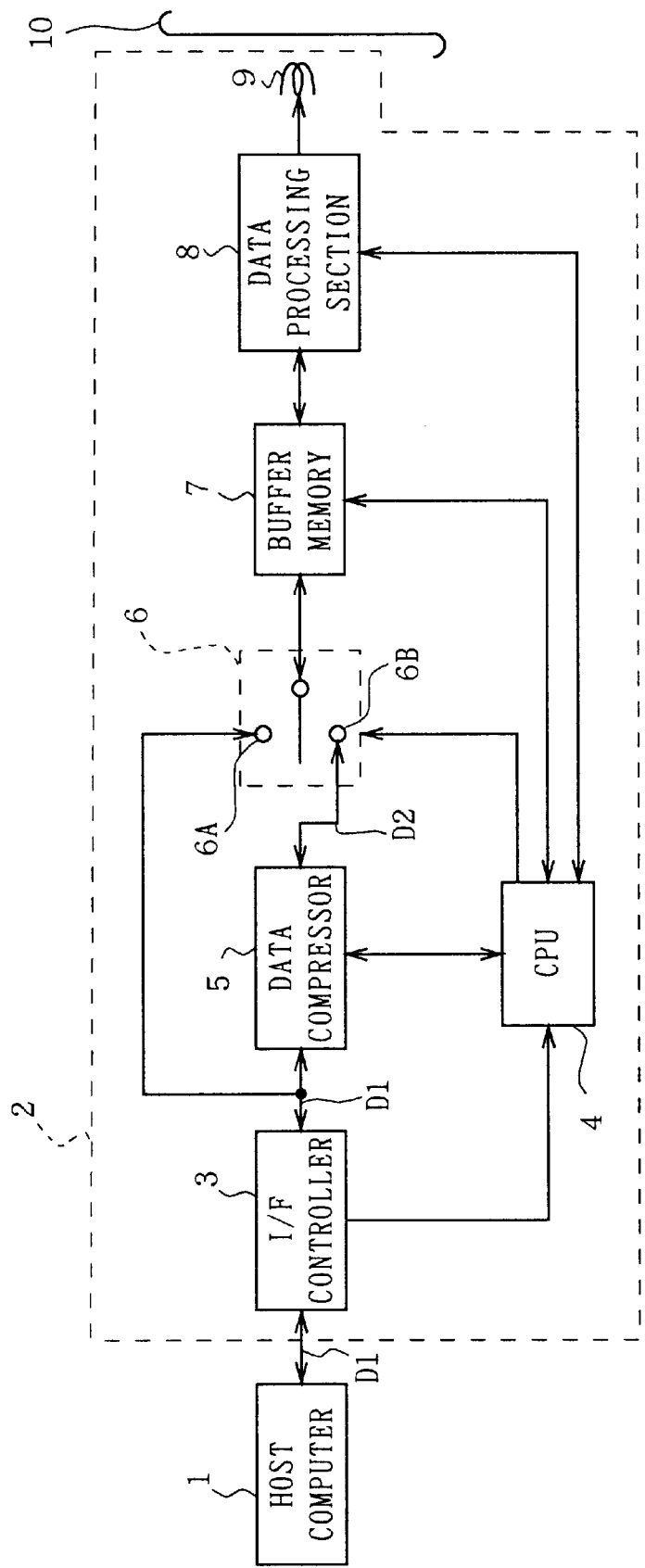
FIG. 1 is a block diagram showing an embodiment of a constitution of a tape streamer.
Figure 2:
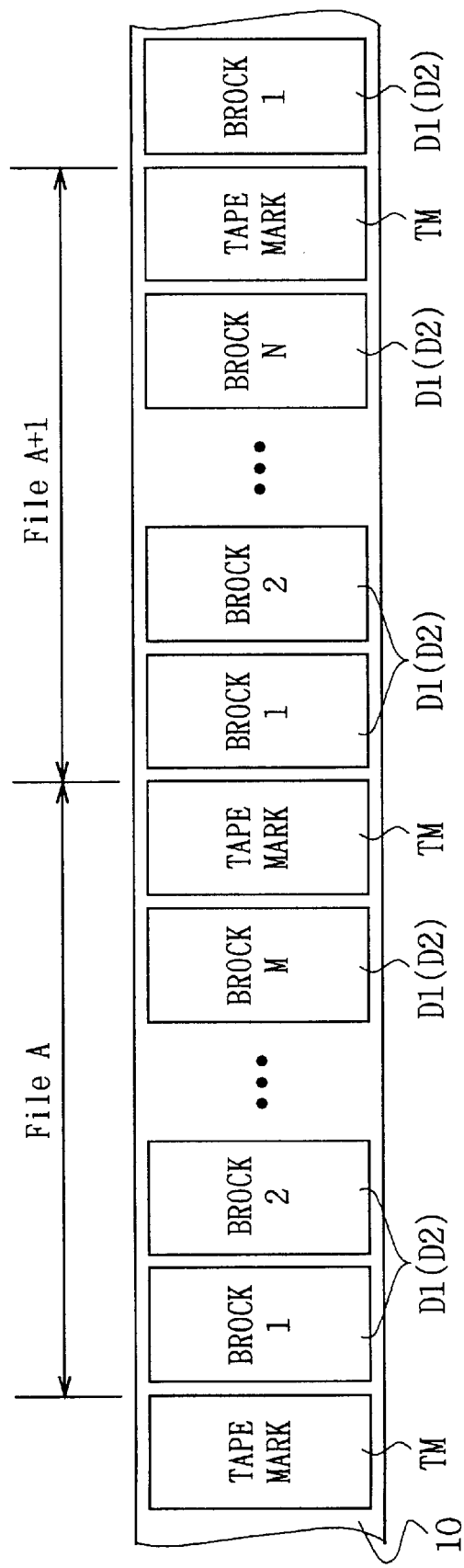
FIG. 2 is a conceptual diagram showing a typical format for recording file data on a magnetic tape by the tape streamer.

In FIG. 4 in which the same reference numerals are applied to parts corresponding to FIG. 1, numeral 20 generally shows a tape streamer according to an embodiment to which the present invention is applied, and has the same constitution as a tape streamer 2 of FIG. 1 except for a point where a data compressor 21 delivers data-extension information to a CPU 22 as a data-extension information signal S10 and a point where the CPU 22 causes a magnetic tape 10 to record the original data D1 on the basis of the data-extension information signal S10 as necessary at the time of the compression mode.

That is, in the case of this tape streamer 20, the CPU 22 selects either of the non-compression mode and the compression mode on the basis of a command given from a host computer 1.

At the time of the non-compression mode, the CPU 22 controls and causes the switch circuit 6 to select the first switching terminal 6A, and thereby gives the original data D1 of each data block which is outputted from the interface controller 3, to a recording head 9 via the switch circuit 6, a buffer memory 7, and a data processing section 8 sequentially, in order to record this on the magnetic tape 10.

On the other hand, at the time of the compression mode, the CPU 22 controls and causes the switch circuit 6 to select the second switching terminal 6A.

At this time, the CPU 22 judges based on the data-extension information signal supplied from the data compressor 21, for each data block whether or not the data extension has occurred in consequence of the compression processing. In the case where it has determined that the data extension has not occurred, with respect to the subsequent data block, the compressed data D2 is sent to the buffer memory 7 via the switch circuit 6 in order to record this on the magnetic tape 10 along with the identifying information indicating compressed data.

Contrary to this, in the case where it has determined that the data extension has occurred, the CPU 22 transfers the very data block of the compressed data D2 to the buffer memory 7, and then causes the switch circuit 6 to select the first switching terminal 6A. Thereby, with respect to a stated number (hereinafter, this number is referred to as the number of the original-data recording blocks) of the subsequent blocks, the non-compressed original data D1 is sent to the buffer memory 7 via the switch circuit 6 so as to be recorded on the magnetic tape 10 along with identifying information indicating non-compressed data.

In addition, after recording the original data D1 on the magnetic tape 10 with respect to the data blocks of the number of the original-data recording block, the CPU 22 controls and causes the switch circuit 6 to select the second switching terminal 6B again, thereby causing the magnetic tape 10 to record the compressed data D2 along with the identifying information indicating compressed data, with respect to the subsequent data blocks. After this, every time when it is determined based on the data-extension information signal S10 that the data extension has occurred, the CPU22 sequentially executes the same processing.

In this way, in this tape streamer 20, with respect to a string of data in which the data extension is apt to occur in consequence of the compression processing, the non-compressed original data D1 is recorded on the magnetic tape 10, thus it is efficiently prevented that the substantial quantity of the recorded data D1 in the tape streamer 20 becomes smaller than the physical storage capacity of the magnetic tape 10.

Note that, for example, in the case where one file of data transmission is finished and a string of data of the next file is transferred from the host computer 1, the property of the string of data is possible to change.

Therefor, at the time of the compression mode, in the case where a record command of the tape mark TM has been supplied from the host computer 1 in a state of causing the switch circuit 6 to select the first switching terminal 6A, the CPU 22 controls and causes the switch circuit 6 to select the second switching terminal 6B, thereby, with respect to the head data block of the next file, the compressed data D2 is recorded on the magnetic tape 10.

In the case of this embodiment, the host computer 1 delivers the data size of the block to be transmitted to the tape streamer 20 as the data-size information, for each file.

Then, the CPU 22 of the tape streamer 20 changes the number of the original-data recording blocks on the basis of the data size of each data block of the file which is obtained from the data-size information such that it becomes smaller when the data size is large and it becomes larger when the data size is small (for example, the number of the original-data recording blocks is changed into 10 to 15 when the data size is 1 [kbyt], or into 2 to 3 when the data size is 1 [Mbyt], in a stepwise manner or a linear manner).

By this, the tape streamer 20 improves the capability of following the change of the property of the strings of data, and thus further alleviates bad influence in consequence of the data extension.

(2) Procedure in Compression Mode

Figure 5:
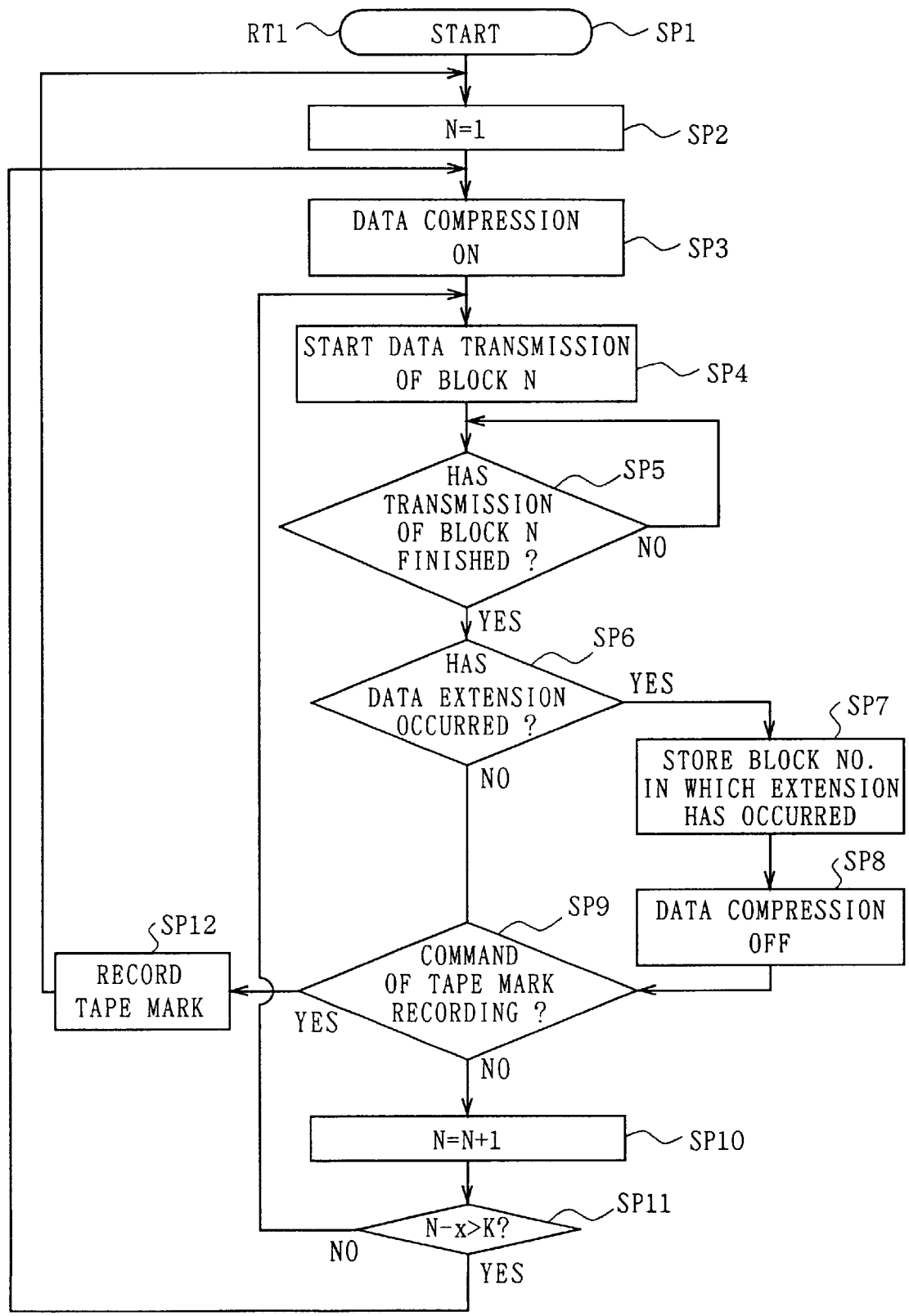
FIG. 5 is a flow chart showing a procedure of a compression mode.

Here, in fact, the CPU 22 controls the interface controller 3, the data compressor 21, the buffer memory 7, and the data processing section 8 in accordance with the compression mode procedure RT1 shown in FIG. 5, in order to record the data D1 which is given from the host computer 1 in units of a block, as described above.

That is, at the time of the compression mode, the CPU 22 starts the compression mode procedure RT1 at step SP1, at following step SP2, stores the block number N of the data block to be compressed as 1, and sets the number of the original-data recording blocks to a stated value K on the basis of the data-size information which is given from the host computer 1. Then, the CPU 22 proceeds to step SP3, and controls and causes the switch circuit 6 to select the second switching terminal 6B.

Next, the CPU 22 proceeds to step SP4 and controls the interface controller 3, the data compressor 21, and the buffer memory 7, so that one data block of the data D1 is subjected to the compression coding in the data compressor 21, the resulted compressed-data D2 is delivered to the data processing section 8, and this is recorded on the magnetic tape 10 via the recording head 9.

Then the CPU 22 proceeds to step SP5 to judge based on the transmission information which is given from the interface controller 3, the data compressor 21, and the buffer memory 7 whether or not the very data block of the compressed data D2 has been finished being transferred to the data processing section 8.

If the CPU 22 obtains a positive result at step SP5, it proceeds to step SP6 to judge based on the data-extension information signal S10 which is supplied from the data compressor 21 whether or not the data length of the compressed data D2 of the very data block has become larger than the data length of the original data D1 (that is, whether or not the data extension has occurred).

If the CPU 22 has obtained a negative result at step SP6, it proceeds to step SP9, after this, it sequentially processes step SP9, step SP10, and step SP11 as described below, and then returns to step SP4.

On the contrary, if the CPU 22 obtains a positive result at step SP6, it proceeds to step SP7 to store the block number N of the very data block, and at following step SP8, it controls and causes the switch circuit 6 to select the first switching terminal 6A.

Thereafter, at step SP9, the CPU 22 judges whether or not a record command of the tape mark TM has been given from the host computer 1, if a positive result is obtained, proceeds to step SP12 to control and cause the data processing section 23 to record the tape mark TM on the magnetic tape 10, and then returns to step SP2.

On the contrary, if the CPU 22 obtains a negative result at step SP9, it proceeds to step SP10 to add one to the value of the block number N which has been stored at step SP2 and store the resulted value newly.

Thereafter, the CPU 22 proceeds to step SP11, and subtracts the block number x which has been stored at step SP7 from the block number N which has been stored at step SP10, and judges whether or not the resulted value of the subtraction is larger than the set value K of the number of the original-data recording block which has been set at step SP2.

Here, to obtain the negative result at step SP11 means that the original data D1 of the data blocks for the number of the original-data recording blocks subsequent to the block in which the data extension has occurred in consequence of the compression processing, have been not transferred yet to the data processing section 8. At this time, the CPU 22 returns to step SP4, and then repeats the loop of the steps SP4-SP5-SP6 (-SP7-SP8)-SP9-SP10-SP11-SP4, until the positive result is obtained at step SP11.

On the other hand, to obtain the positive result at step SP11 means that the data D1 of the data blocks for the number of the original-data recording blocks subsequent to the block in which the data extension has occurred, has finished being transferred to the buffer memory 7. At this time, the CPU 22 returns to step SP3 and controls the switch circuit 6 so as to cause it to select the second switching terminal 6B.

Then, the CPU 22 proceeds to step SP4, and then sequentially processes the steps following step SP4, as with the case described above.

(3) Operation and Effects of the Embodiment

With the above constitution, the tape streamer 20 sequentially compresses each data block of the data D1 which is supplied from the host computer 1 to record it on the magnetic tape 10, at the time of the compression mode.

At this time, the tape streamer 20 sequentially checks whether or not the data extension has occurred in consequence of the compression processing for the data block. In the case where the data extension has not occurred, the compressed data D2 is recorded on the magnetic tape 10 with respect to the subsequent data blocks. On the other hand, in the case where the data extension has occurred, the non-compressed original data D1 is recorded on the magnetic tape 10, with respect to the data blocks for the preset number of the original-data recording blocks subsequent to the very data block.

So, the tape streamer 20 can record a string of data in which the data extension is apt to occur in consequence of the compression processing, on the magnetic tape 10 in a non-compressed state, therefore, it can be prevented that the substantial quantity for recording data on the magnetic tape 10 by the tape streamer 20 becomes smaller than the physical storage capacity of the magnetic tape 10.

Figure 3:
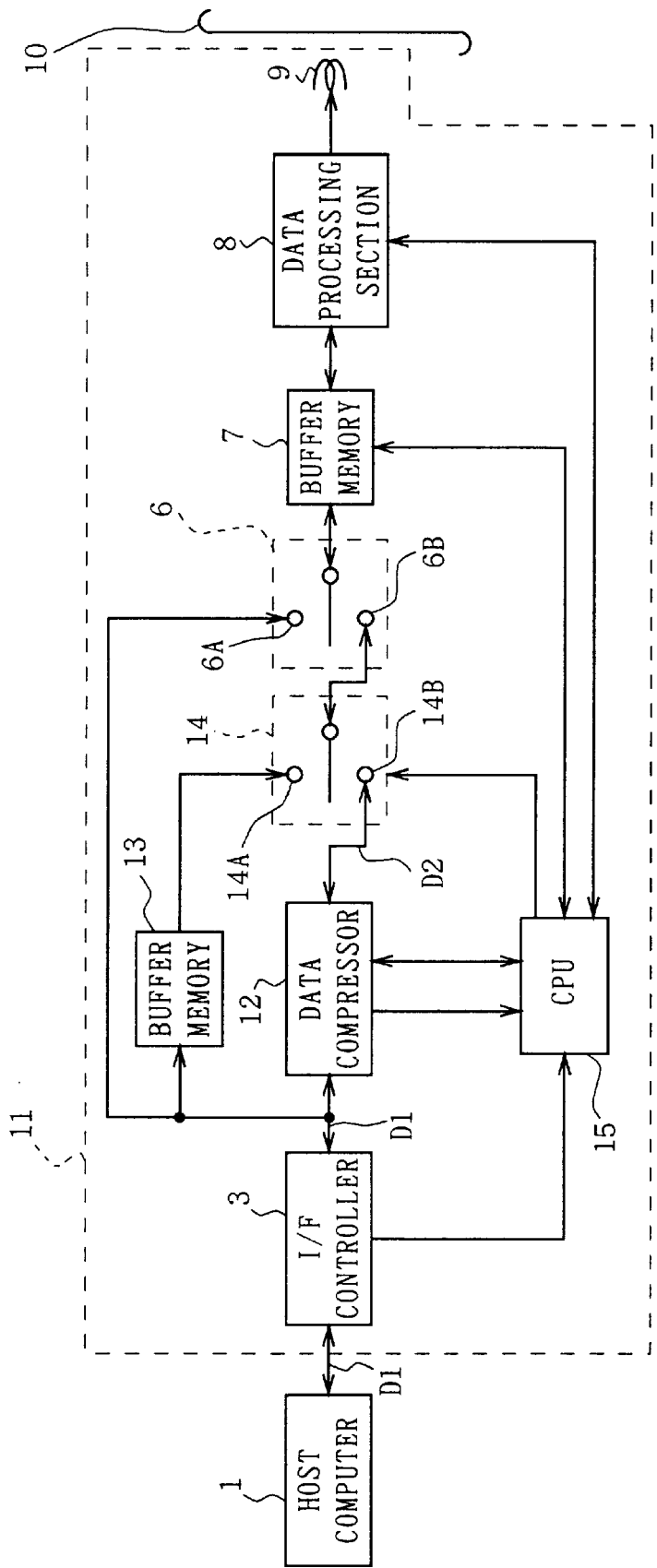
FIG. 3 is a block diagram showing an embodiment of the constitution of the tape streamer.

Besides, in the tape streamer 20, it is not required to add the original-data holding buffer-memory 13, the switch circuit 14, etc., to the aforementioned tape streamer 2 of FIG. 1 like the tape streamer 11 of FIG. 3, therefore, the constitution can be simplified in comparison with the tape streamer 11 of FIG. 3 and the manufacturing cost can be suppressed.

According to the above constitution, in the case where the data extension has occurred at the time of the compression mode, the non-compressed original data D1 is recorded on the magnetic tape 10 with respect to the preset stated number of data blocks, therefore, a string of data in which the data extension is apt to occur in consequence of the compression processing can be recorded on the magnetic tape 10 in a non-compressed state, and the tape streamer 20 can be simply constituted, so that a tape streamer having a simple constitution can be realized which is able to alleviate bad influence of data extension which occurs in consequence of the compression processing.

(4) Other Embodiments

Note that, in the above embodiment, the present invention is applied to the tape streamer 20. However, the present invention is not limited thereto and can be applied to the other various data recording apparatuses which record supplied data on a recording medium.

Further, in the above embodiment, the data compressor 21 is used both as the compressing means for compressing data in units of a data block, and the detecting means for detecting in units of a data block whether or not the data extension has occurred in consequence of the compression processing which is performed by the compressing means. However, the present invention is not limited thereto and the data compressor 21 can deliver information on the data length of the original data D1 and the data length of the compressed data D2 to the CPU 22 so that the CPU 22 judges based on the information whether or not the data extension has occurred.

Further, in the above embodiment, the recording means is comprised of the CPU 22, the switch circuit 6, the buffer memory 7, the data processing section 8, and the recording head 9, wherein at the time of the compression mode, the data D1 compressed by the data compressor 21 is recorded on the magnetic tape 10 when the data extension has not occurred in consequence of the compression processing, and on the other hand, when the data extension has been detected by the data compressor 21, the original data is recorded on the magnetic tape 10 with respect to the stated number (the number of the original-data recording blocks) of data blocks subsequent to the data block in which the data extension has occurred. However, the present invention is not limited thereto and the other various constitution can be adopted.

Furthermore, in the above embodiment, the CPU 22 automatically changes the number of the original-data recording blocks on the basis of the data size information which is given from the host computer 1. However, the present invention is not limit thereto and the number of the original-data recording blocks can be changed by manual operation of the operator.

As described above, a data recording apparatus comprises a compressing means for compressing data in stated units of a data block, a detecting means for detecting in units of the data block whether or not the data extension has occurred in consequence of the compression processing which has been performed by the compressing means, and a recording means, at the time of the compression mode, on the basis of the detection result of the detecting means, for recording data compressed by the compressing means, on the recording medium in the case where the data extension has not occurred in consequence of the compression processing, and on the other hand, in the case where the data extension has occurred in consequence of the compression processing, for recording the original data on the recording medium with respect to the stated number of the data blocks subsequent to the data block in which the data extension has occurred. Thereby, with respect to a string of data in which the data extension is apt to occur, the non-compressed original data can be recorded on the recording medium, thus a data recording apparatus can be realized with a simple construction which can alleviate bad influence of data extension which occur in consequence of the compression processing.

Furthermore, the data recording method comprises a first step of compressing data in stated units of a data block and detecting in units of the data block whether or not the data extension has occurred duet to the compression processing, and a second step of recording the compressed data on the recording medium in the case where the data extension has not occurred in consequence of the compression processing, and on the other hand, in the case where the data extension has occurred in consequence of the compression processing, of recording the original data on the recording medium with respect to a stated number of the data blocks subsequent to the data block in which the data extension has occurred. Thereby, with respect to a string of data in which the data extension is apt to occur, non-compressed original data can be recorded on the recording medium, thus a data recording method can be realized with a simple construction which can alleviate bad influence of data extension which occur in consequence of the compression processing.

While there has been described in connection with the preferred embodiments of the invention, it will be obvious to those skilled in the art that various changes and modifications may be aimed, therefore, to cover in the appended claims all such changes and modifications as fall within the true spirit and scope of the invention.

What is claimed is:

1. A data recording apparatus for recording data supplied from an external device in the form of data blocks on a recording medium, said data recording apparatus comprising:

a compressing means for compressing at least one of said data blocks to generate respective compressed data blocks;

a detecting means for detecting whether or not a data extension has occurred as a result of a compression processing performed by said compressing means, said detecting being performed for each of said compressed data blocks; and a recording means for recording data on said recording medium;

wherein when said apparatus is in a compression mode and said detecting means does not detect the occurrence of a data extension, all of said data blocks of said supplied data are compressed and the respective compressed blocks are recorded; and wherein when said apparatus is in a compression mode and said detecting means detects the occurrence of a data extension corresponding to a compressed data block said compressed data block is recorded and a predetermined number of data blocks following said compressed block are not subjected to said compressing and detecting operations and are recorded as uncompressed data blocks, said compressing and detecting operations being resumed after the recording of said predetermined number of data blocks.

2. The data recording apparatus according to claim 1, wherein the number of said predetermined number of data blocks is varied in at least one of a step-wise manner and a linear manner according to the size of said data blocks of said supplied data.

3. A data recording method for recording data supplied from an external device in the form of data blocks on a recording medium, said method comprising the steps of:

compressing at least one of said data blocks to generate respective compressed data blocks;

detecting whether or not a data extension has occurred as a result of said compressing, said detecting being performed for each of said compressed data blocks; and recording data on said recording medium;

wherein when said apparatus is in a compression mode and a data extension is not detected for any of said data blocks of said supplied data, all of said data blocks of said supplied data are compressed and the respective compressed blocks are recorded; and wherein when said apparatus is in a compression mode and a data extension corresponding to a compressed data block is detected said compressed data block is recorded and a predetermined number of data blocks following said compressed block are not subjected to said compressing and detecting operations and are recorded as uncompressed data blocks, said compressing and detecting operations being resumed after the recording of said predetermined number of data blocks.

4. The data recording method according to claim 3, further comprising the step of varying the number of said predetermined number of data blocks in at least one of a step-wise manner and a linear manner according to the size of said data blocks of said supplied data.

* * * * *